United States Patent [19]

Borden

[11] Patent Number: 4,513,168

[45] Date of Patent: Apr. 23, 1985

[54] THREE-TERMINAL SOLAR CELL CIRCUIT

[75] Inventor: Peter G. Borden, Palo Alto, Calif.

[73] Assignee: Varian Associates, Inc., Palo Alto, Calif.

[21] Appl. No.: 602,033

[22] Filed: Apr. 19, 1984

[51] Int. Cl.³ .............................................. H01L 31/06
[52] U.S. Cl. ..................................... 136/244; 136/249
[58] Field of Search ........................... 136/244, 249 TJ

[56] References Cited

U.S. PATENT DOCUMENTS 4,387,265  6/1983  Dalal .................................... 136/249
4,461,922  7/1984  Gay et al. ........................... 136/249

OTHER PUBLICATIONS

J. C. C. Fan et al., "Optimal Design of High-Efficiency Tandem Cells," *Conf. Record, 16th IEEE Photovoltaic Specialists Conf.* (1982), pp. 692–701.

L. M. Fraas et al., "Ternary III–V Solar Cells for Multicolor Applications", *Conf. Record, 16th IEEE Photovoltaic Specialists Conf.* (1982), pp. 655–662.

*Primary Examiner*—Aaron Weisstuch
*Attorney, Agent, or Firm*—Stanley Z. Cole; Richard B. Nelson

[57] ABSTRACT

Photovoltaic solar cells have improved efficiency when constructed in monolithic form with two different band gap energy junctions. Solar light goes first through an upper layer containing a high band gap energy junction which absorbs the short-wavelength components of light. Then the remaining long-wavelength components are absorbed in a second active layer containing a low band gap energy junction. The cell may comprise p-n-n-p type layers.

According to the invention, each low band-gap, low-voltage junction is made to have ½ the voltage of the high band-gap high-voltage junctions. The junctions are then connected such that the high-voltage junctions are in parallel and the series connection of low-voltage junctions is also in parallel with them. The junction voltages are invariant so the parallel connection works for any light spectrum.

8 Claims, 4 Drawing Figures

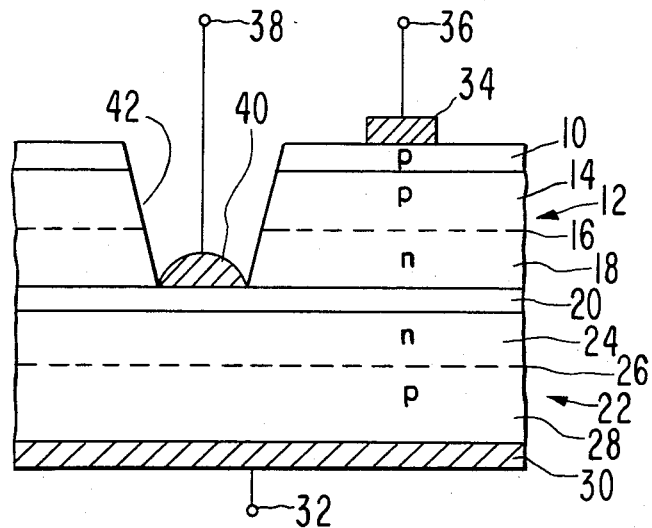
FIG.1A
PRIOR ART
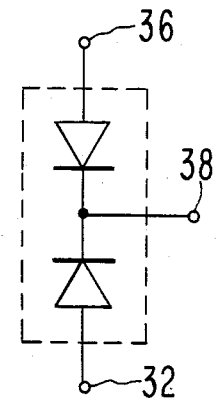
FIG.1B
PRIOR ART
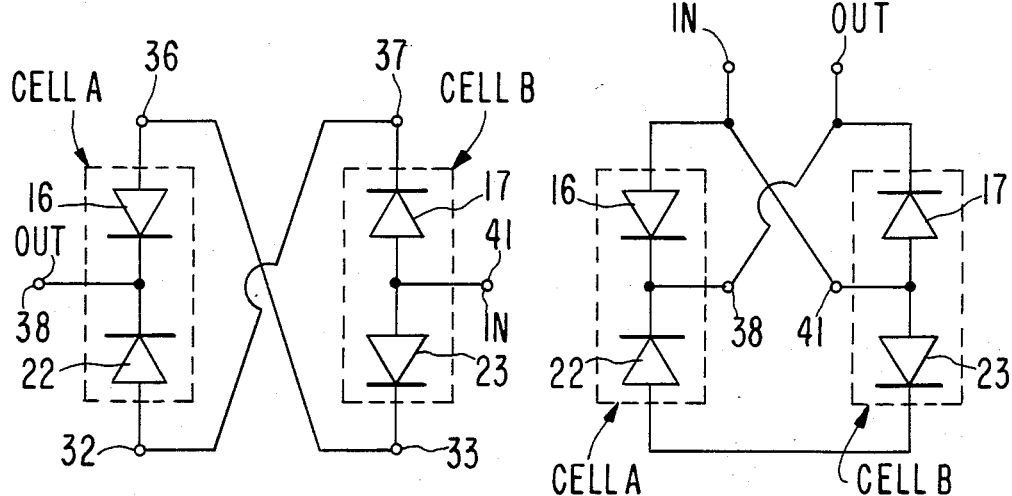
FIG.2
PRIOR ART
FIG.3

THREE-TERMINAL SOLAR CELL CIRCUIT

FIELD OF THE INVENTION

The invention pertains to photovoltaic cells such as used for direct conversion of sunlight to electricity. Sunlight contains a wide spectrum of photon energies. A simple photovoltaic cell is most efficient when the band gap energy at its p-n junction is just below the incident photon energy. Therefore the efficiency suffers when such a cell is used for sunlight, which, as mentioned above, contains a spectrum of photon energies.

PRIOR ART

Early on in the work on solar cells it became obvious that efficiency could be improved by a multiple junction cell. The light would fall on a semiconductor layer containing a high voltage p-n junction with a relatively high band gap energy. The short waves would be absorbed, giving charge carriers enough energy to cross the gap. The longer waves do not have enough energy to generate charge carriers and thus would pass through the layer, which is relatively transparent to them. Beneath this first junction would be a second, lower voltage p-n junction in a layer with lower band gap energy which absorbs the low energy waves and drives current across the low-voltage junction.

There are some inherent problems in the multi-junction cell. It is highly desirable to have a monolithic structure with the junctions in successive layers with the proper doping. If internal interconnect problems are to be avoided, this naturally results in the junctions in a sequential direction being p-n-n-p or n-p-p-n. Thus the voltages across the two are in opposition. Because the cells are low voltage generators, it is desirable to connect them in series.

Several schemes have been tried to make a p-n/p-n stack so the voltages will add in series. Among these have been tunneling junctions between the sub-cells, or transparent ohmic connections. Neither of these has been very successful.

U.S. Pat. No. 4,356,341 issued Oct. 26, 1982 to Peter G. Borden, describes a two-junction cell in which the junctions are connected in series by an array of metal contacts through apertures in the insulator between the upper and lower junction layers. In this way only a small fraction of the cell area is opaque and hence unproductive, while the junctions are electrically in series. There is still a serious drawback to series-connected junctions. The current through the two junctions must be the same. Since they respond to different light wavelengths, this current equality is a function of the spectral distribution of the incident light. For solar light, this distribution is not constant.

An alternative prior-art approach for connecting the two junctions is illustrated by FIG. 1A wherein the junctions are formed in the straightforward back-to-back polarity such as p-n-n-p, and a third external lead is connected to a conductive layer at the n-n interface. This would allow the cells to be connected in parallel, but unfortunately, they have different voltages. As explained below in connection with FIG. 2, this can be made equivalent to a series connection, but the above-described problem of series connection still applies.

SUMMARY OF THE INVENTION

The purpose of the invention is to provide a series-parallel connection of triple-lead photovoltaic cells for high-efficiency conversion of solar light into electricity.

BRIEF DESCRIPTION OF THE FIGURES

FIG. 1A is a schematic cross-section of a prior art cell with two junctions and three terminals.

FIG. 1B is a connection diagram of the active junctions of the cell of FIG. 1A.

FIG. 2 is a connection diagram of a pair of three-terminal cells such as the one of FIG. 1A.

FIG. 3 is a connection diagram of a pair of three-terminal cells in a series-parallel circuit embodying the invention.

DESCRIPTION OF THE PREFERRED EMBODIMENTS

In the prior-art cell of FIG. 1A the series of active layers in a preferably monolithic semiconductor crystal is, starting from the top side where light enters: a window and anti-reflection layer 10 of high-conductivity p-type material, a semiconductive layer 12 containing an upper region 14 doped for p-type conductivity, a p-n junction 16 having a relatively high band-gap energy, and a lower region 18 of n-type, a high-conductivity transparent contact layer 20, a second semiconductive layer 22 containing an upper region 24 of n-type, an n-p junction 26 having a relatively low band-gap energy, and a lower p-type region 28. On the bottom of region 28 is bonded a metallic electrode 30 adapted to connect to an external lead 32.

Contact layers 10, 20 may be of the same material as active layers 12, 22, but more highly doped. Also, a high-conductivity p-type substrate layer may be present between lower active layer 28 and electrode 30.

Electrical contact to upper window 10 is made via a bonded metallic electrode 34 which is preferably a grid whose conductors cover only a small part of the surface area, leaving the rest transparent to incoming light. Grid 34 is adapted to connect to an external lead 36.

An intermediate lead 38 connects to contact layer 20 by an array of metallic grid conductors 40 deposited, as by evaporative deposition, in apertures 42 which are etched, as by photolithographic processes, through window layer 10 and upper semiconductor layer 12.

FIG. 1B shows the schematic electrical connections. The directions of current flow across the two junctions are opposing. The junctions can not be connected directly in parallel because they generate different voltages.

FIG. 2 shows how two three-terminal cells may be connected in a series-parallel circuit. In both cell A and cell B the upper junctions 16, 17 have high band-gap energies. The lower junctions 22, 23 have low band-gap energies. The external connections 33, 37, 41 of cell B correspond physically to connections 32, 36, 38 of cell A. However, the conductivity types of cell B have been reversed, as indicated by the arrows, to be n-p-n instead of p-n-p. With the external connections of FIG. 2 each high-voltage junction 16, 17 is in series with a low-voltage junction 23, 22 of the other cell. The total voltage of the two series sets is the same, so the sets may be connected in parallel to form a circuit unit. Any number of these two-cell circuit units may be series-connected to produce a higher output voltage, or parallel connected to produce a higher output current.

The series connection has the disadvantage mentioned above of requiring equal currents in the high- and low-voltage junctions. Even if these can be equalized for one condition of illumination, they will be different for another condition.

FIG. 3 shows a connection-diagram embodying the invention. In each circuit unit there is a parallel connection of three elements; i.e., the two high voltage junctions 16, 17, and a series connection of the low-voltage junctions 22 and 23. This will work efficiently when the voltage of the lower junctions is one-half that of the upper junctions. This is not an unreasonable relation.

The voltage of the junctions are generally dependent only on the properties of the semiconductive materials. They are relatively fixed with respect to changes in illumination, so that once constructed for the correct voltages, that condition will not vary.

It will be obvious to those skilled in the art that other embodiments of the invention may be made. The above description is intended to be exemplary and not limiting.

For example, the 3-terminal photovoltaic cells may have more than two active junctions, provided that interconnections between junctions which are not connected to the intermediate terminal lead must be series-connected, such as described in U.S. Pat. No. 4,356,341. The scope of the invention is to be limited only by the following claims and their legal equivalents.

What is claimed is:

1. A photovoltaic generator unit comprising a pair of photovoltaic cells, said cells adapted to receive incoming light from a given direction, each cell comprising, in electrical connection in the said direction:
   a light-permeable first electrode,
   a first semiconductive layer containing a photovoltaic junction having a high band-gap energy and a first polarity with respect to said direction,
   a light-permeable second electrode,
   a second semiconductive layer containing a photovoltaic junction having a low band-gap energy and a second polarity opposite said first polarity, and
   a third conductive electrode;
   said first polarities of said cells being opposite,
   said first electrode of each of said cells being electrically connected to said second electrode of the other cell,
   said third electrodes being electrically connected together,
   said low band-gap energies being approximately one-half of said high band-gap energies, and
   means for external connection to each of said first electrodes.

2. The unit of claim 1 wherein said semiconductive layers are monolithic.

3. The unit of claim 1 wherein said second electrode is connected to a high-conductivity transparent layer between said first and second semiconductive layers.

4. The unit of claim 1 further comprising a high-conductivity substrate layer.

5. The unit of claim 1 further comprising a transparent high-conductivity layer between said first electrode and said first semiconductor layer.

6. A photovoltaic generator comprising a plurality of said units of claim 1 wherein said means for external connection are connected in series.

7. The unit of claim 1 wherein said first electrode comprises an array of metallic grid members.

8. The unit of claim 1 wherein said second electrode comprises an array of metallic grid members.

* * * * *